(12) United States Patent
Matsui et al.

(10) Patent No.: US 7,759,888 B2
(45) Date of Patent: Jul. 20, 2010

(54) AC MOTOR CONTROLLER

(75) Inventors: Hirokazu Matsui, Hitachiota (JP);
Takefumi Sawada, Ishioka (JP);
Shigeyuki Yoshihara, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 260 days.

(21) Appl. No.: 11/911,487

(22) PCT Filed: Apr. 15, 2005

(86) PCT No.: PCT/JP2005/007667

§ 371 (c)(1),
(2), (4) Date: Oct. 12, 2007

(87) PCT Pub. No.: WO2006/112033

PCT Pub. Date: Oct. 26, 2006

(65) Prior Publication Data

US 2009/0059446 A1 Mar. 5, 2009

(51) Int. Cl.
*H02P 6/00* (2006.01)
*H02P 27/04* (2006.01)

(52) U.S. Cl. .................. 318/400.29; 318/430; 318/802; 361/93.1

(58) Field of Classification Search .................. 361/42, 361/48, 85, 87, 93.1, 119; 318/400.29, 603, 318/610, 802, 430; 324/510, 511
See application file for complete search history.

(56) References Cited

U.S. PATENT DOCUMENTS

| | | | | |
|---|---|---|---|---|
| 4,389,694 A | * | 6/1983 | Cornwell, Jr. ................. | 361/48 |
| 4,857,918 A | * | 8/1989 | Nukushina et al. ..... | 340/870.01 |
| 5,825,150 A | * | 10/1998 | Kachi et al. .................. | 318/610 |
| 6,107,926 A | | 8/2000 | Kifuku et al. | |
| 6,140,789 A | * | 10/2000 | Kachi et al. .................. | 318/603 |
| 6,232,737 B1 | * | 5/2001 | Kachi et al. .................. | 318/610 |
| 6,876,203 B2 | * | 4/2005 | Blades ........................ | 324/536 |
| 6,885,162 B2 | * | 4/2005 | Stridsberg .............. | 318/400.29 |
| 6,909,977 B2 | * | 6/2005 | Orton .......................... | 702/65 |
| 6,928,854 B2 | * | 8/2005 | Hartz et al. .................. | 73/1.16 |
| 6,930,490 B2 | * | 8/2005 | Saunders et al. ............ | 324/511 |

(Continued)

FOREIGN PATENT DOCUMENTS

JP     6-66901 A     3/1994

(Continued)

OTHER PUBLICATIONS

International Search Report dated Jul. 5, 2005 w/English translation (two (2) pages).

(Continued)

*Primary Examiner*—Paul Ip
(74) *Attorney, Agent, or Firm*—Crowell & Moring, LLP

(57) ABSTRACT

There is provided an AC motor controller capable of detecting an abnormal state of a motor cable while an AC motor is operating without using a special circuit but using a processor.

The AC motor controller includes an AC motor; an inverter for driving the AC motor with a motor current through a motor cable; and a motor current detector for detecting the motor current flowing in the motor cable of the AC motor, in which a processor detects an abnormal state of the motor cable such as an inter-phase short circuit and an open circuit based on the motor current detected by the motor current detector.

1 Claim, 5 Drawing Sheets

U.S. PATENT DOCUMENTS

| | | | |
|---|---|---|---|
| 7,095,598 B2 * | 8/2006 | Scott et al. | 361/85 |
| 7,254,004 B2 * | 8/2007 | Mladenik et al. | 361/93.1 |
| 7,254,520 B2 * | 8/2007 | Hashemian | 702/183 |
| 7,285,961 B2 * | 10/2007 | Shinmoto et al. | 324/541 |
| 7,319,939 B2 * | 1/2008 | Hashemian | 702/183 |
| 7,342,763 B2 * | 3/2008 | Mladenik et al. | 361/119 |
| 7,352,550 B2 * | 4/2008 | Mladenik et al. | 361/87 |
| 7,478,010 B2 * | 1/2009 | Hashemian | 702/151 |
| 7,486,034 B2 * | 2/2009 | Nakamura et al. | 318/139 |
| 2002/0196031 A1 * | 12/2002 | Blades | 324/536 |
| 2004/0054456 A1 | 3/2004 | Yoshida et al. | |
| 2004/0085087 A1 | 5/2004 | Zehentner et al. | |
| 2004/0119427 A1 * | 6/2004 | Stridsberg | 318/254 |
| 2004/0227520 A1 * | 11/2004 | Saunders et al. | 324/511 |
| 2005/0012339 A1 * | 1/2005 | Mikhail et al. | 290/44 |
| 2005/0018371 A1 * | 1/2005 | Mladenik et al. | 361/78 |
| 2005/0182581 A1 * | 8/2005 | Hashemian | 702/105 |
| 2005/0195545 A1 * | 9/2005 | Mladenik et al. | 361/93.1 |
| 2006/0007619 A1 * | 1/2006 | Scott et al. | 361/93.1 |
| 2006/0072270 A1 * | 4/2006 | Mladenik et al. | 361/93.1 |
| 2007/0029986 A1 * | 2/2007 | Nakamura et al. | 323/318 |
| 2007/0064359 A1 | 3/2007 | Shima | |
| 2007/0085548 A1 * | 4/2007 | Shinmoto et al. | 324/508 |
| 2007/0263329 A1 * | 11/2007 | Zhou et al. | 361/42 |
| 2007/0276628 A1 * | 11/2007 | Hashemian | 702/184 |
| 2008/0015817 A1 * | 1/2008 | Hashemian | 702/183 |
| 2008/0084215 A1 * | 4/2008 | Itten et al. | 324/510 |
| 2008/0205106 A1 * | 8/2008 | Nakamura et al. | 363/123 |
| 2008/0296521 A1 * | 12/2008 | Narayanasamy et al. | 250/559.45 |

FOREIGN PATENT DOCUMENTS

| | | |
|---|---|---|
| JP | 10-191551 A | 7/1998 |
| JP | 11-008992 A | 1/1999 |
| JP | 2004-72997 A | 3/2004 |
| JP | 2004-106664 A | 4/2004 |
| JP | 2004-320945 A | 11/2004 |
| JP | 2005-057818 A | 3/2005 |

OTHER PUBLICATIONS

PCT/IPEA/416 (two (2) pages); PCT/IPEA/409 (three (3) pages); Attachments (pp. 2, 3, 3/1, 12-15), and partial English translation (twelve (12) pages).

Japanese Office Action mailed Mar. 16, 2010 and English Translation thereof.

* cited by examiner

AC MOTOR CONTROLLER

TECHNICAL FIELD

The present invention relates to abnormality detection of a cable between a motor and electric converter, and particularly to abnormality detection using an AC motor controller.

BACKGROUND ART

Conventionally, there have been methods for detecting abnormality (such as disconnection and inter-phase short circuit) in a cable connecting an inverter to a motor or a motor circuit. Among such methods is: a technique (Japanese Patent Laid-open No. Hei 6 (1994)-66901) which applies a low voltage to a motor circuit when the motor is not operating and diagnostically evaluates the current flowing through the DC section of an inverter based on diagnostic patterns; and a technique (Japanese Patent Laid-open No. Hei 10 (1998)-191551) which measures the period of time during which a short circuit current continues to flow and determines that a short circuit fault occurs if the duration period is longer than a predetermined time.

The former technique applies a very small voltage to a motor to obtain a DC current pattern before the motor starts operating and detects an inter-phase short circuit based on the DC current pattern obtained. This technique has the disadvantage that although it can detect an inter-phase short circuit before a motor starts operating, it cannot do so while it is operating.

On the other hand, the latter technique is only applicable to DC motors. Therefore, it is difficult to apply this technique to AC motors having constantly changing current values.

An object of the present invention is to provide an AC motor controller capable of detecting an abnormal state of motor cables (such as an inter-phase short circuit and a cable disconnection) while the AC motor is operating without using a special circuit but using a processor.

DISCLOSURE OF INVENTION

A representative AC motor controller of the present invention includes: an AC motor; an inverter for driving the AC motor with three phase a motor current through a motor cable; a motor current detector for detecting the three phase motor currents each flowing in the motor cable connected to the AC motor; and a processor for detecting the occurrence of an abnormal state of the motor cable based on the motor current detected by the motor current detector, the processor identifying the phase of the motor cable in which the abnormal state occurs.

Another representative AC motor controller of the present invention includes: an AC motor driven by multiple motor currents; an inverter for driving the AC motor with the multiple motor currents through multiple motor cables; a motor current detector for detecting the multiple motor currents each flowing in a corresponding one of the multiple motor cables connected to the AC motor; storage means for storing the multiple motor currents detected by the motor current detector; and a processor for comparing the multiple motor currents stored by the storage means with a predetermined value and, if at least two of the multiple motor currents are greater than the predetermined value, determining that an inter-phase short circuit state exists between the motor cables, the processor identifying the phase in the inter-phase short circuit state.

Yet another representative AC motor controller of the present invention includes: an AC motor driven by multiple motor currents; an inverter for driving the AC motor with the multiple motor currents through multiple motor cables; a motor current detector for detecting the multiple motor currents each flowing in a corresponding one of the multiple motor cables connected to the AC motor; storage means for storing the multiple motor currents detected by the motor current detector; and a processor for comparing the multiple motor currents stored by the storage means with a predetermined value and, if at least one of the multiple motor currents are less than the predetermined value, determining that an open circuit state exists in at least one of the motor cables, the processor identifying the phase of the open circuit state.

The present invention can provide an AC motor controller capable of quickly detecting abnormality at low cost.

BEST MODE FOR CARRYING OUT THE INVENTION

Embodiments of the present invention will be described below by referring to the accompanying drawings.

Embodiment 1

An embodiment for detecting a short circuit between phases will be described by referring to FIGS. 1 to 3.

First, a method for detecting an abnormal state in motor cables according to the present invention will be described with reference to an electric vehicle driving control system.

Figure 1:
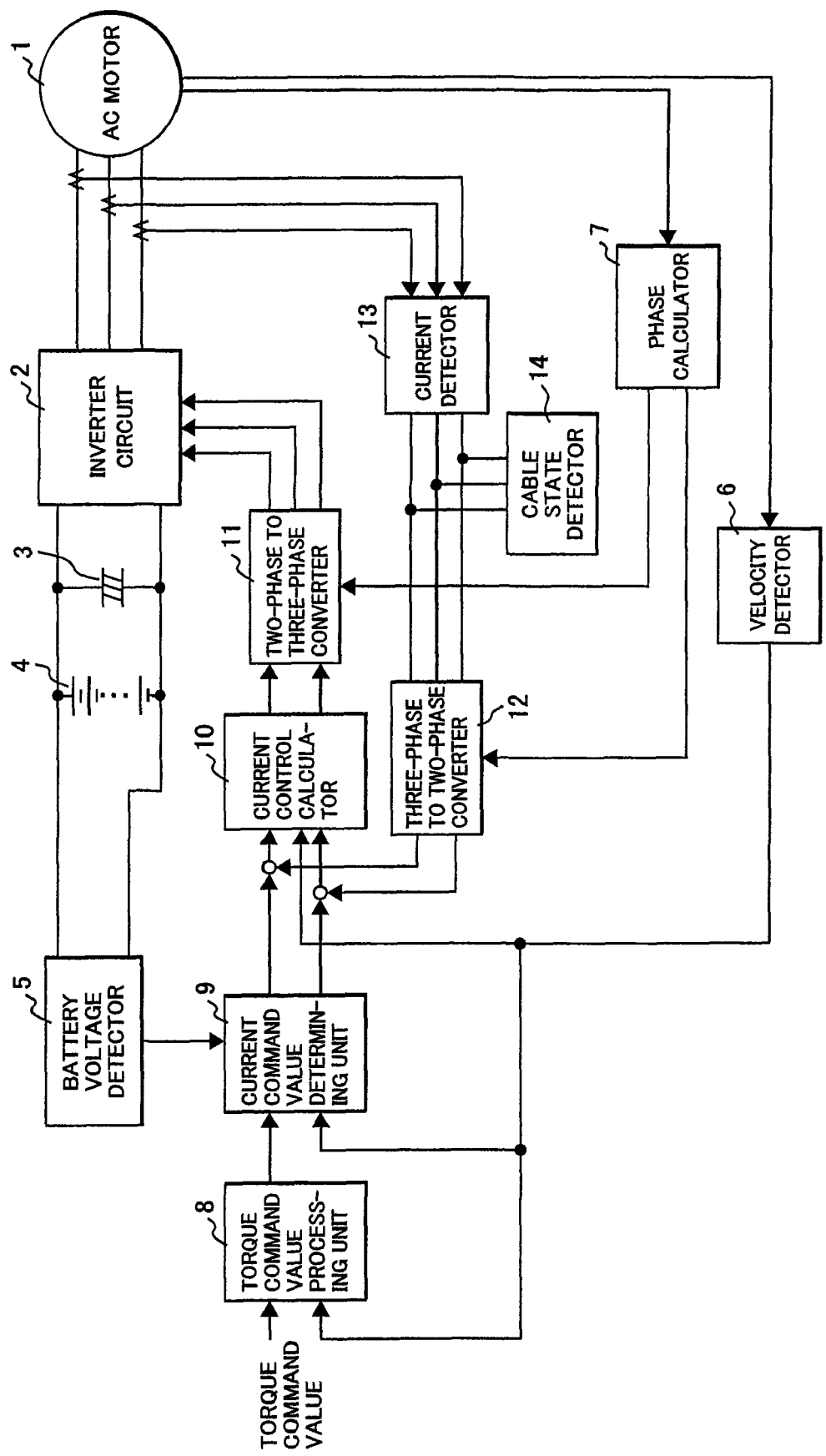
FIG. 1 is a block diagram of an electric vehicle driving system which includes a motor controller for detecting an inter-phase short circuit according to an embodiment of the present invention.

FIG. 1 is a block diagram of an electric vehicle driving system which includes a motor controller of the present embodiment. An AC motor 1 (synchronous motor) is a permanent magnet synchronous motor. An inverter circuit 2 for use as an electric converter operates using a battery 4 as the power source. The AC motor 1 is powered through the inverter circuit 2. The AC motor 1 has: a velocity detector 6 including an encoder serving as a rotation sensor; and a phase calculator 7 including a magnetic pole position sensor which detects the position of magnetic poles. They transfer the information on the rotational speed and phase of the AC motor 1 to the controller.

The battery 4 supplies a DC current to the inverter circuit 2. A battery voltage detector 5 for measuring the voltage of the battery 4 is connected to the DC current inputs of the inverter 2, between which is inserted a capacitor 3 for smoothing the voltage of the battery 4. The battery voltage detector 5 transfers the measured voltage of the battery 4 to a current command value determining unit 9.

The inverter circuit 2 outputs three-phase AC currents (U, V and W phases). On the AC current outputs of the inverter circuit 2 is a current detector 13 for detecting each of the U, V and W phase currents which are inputted to the AC motor 1. The three phase AC currents detected by the current detector 13 are converted to d-axis and q-axis current values at a three-phase to two-phase converter 12 based on a phase angle θ calculated by the phase calculator 7. The converted d-axis and q-axis current values are transferred to the inputs of a current control calculator 10.

The current command value determining unit 9 outputs d-axis and q-axis current command values based on: a rotational speed N outputted from the velocity command detector 6; the voltage of the battery 4 detected at the battery voltage detector 5; and a torque command value τ* processed at a torque command value processing unit 8.

The current control calculator 10 calculates d-axis and q-axis voltage command values by PI control based on: the d-axis and q-axis current command values outputted from the current command value determining unit 9; the detected currents converted to the d-axis and q-axis current values at the three-phase to two-phase converter 12; and the rotational speed N outputted from the velocity detector 6. The d-axis and q-axis voltage command values calculated at the current control calculator 10 are inputted to a two-phase to three-phase converter 11, which in turn calculates three-phase AC voltage command values based on the phase angle θ calculated at the phase calculator 7.

Inside the two-phase to three-phase converter 11 is a PWM signal controller (not shown). A PWM signal calculator converts the three-phase AC voltage command values to switching control signals for controlling switching devices in the inverter circuit 2. The switching control signals are supplied to switching devices for each phase in the inverter circuit 2.

The three-phase currents detected by the current detector 13 are inputted to a cable state detector 14. The cable state detector 14 simultaneously samples the currents of the U, V and W phases on a regular basis. The sampled values are stored in, for example, a storage device in a processor. Here, it is preferable that the sampling frequency is sufficiently lower than the driving frequency of the AC motor 1.

The currents flowing between the AC motor 1 and inverter circuit 2 show a distinction between the case where there occurs an abnormal state such as an inter-phase short or open circuit in the motor cables connecting the inverter circuit 2 to the AC motor 1 and the case where no such abnormality occurs. For example, the phase relationships between or current amplitudes of the U, V and W phases differ between the two cases. The embodiment will describe an example of determination of an abnormal state based on variation in the motor current amplitudes.

Figure 3:
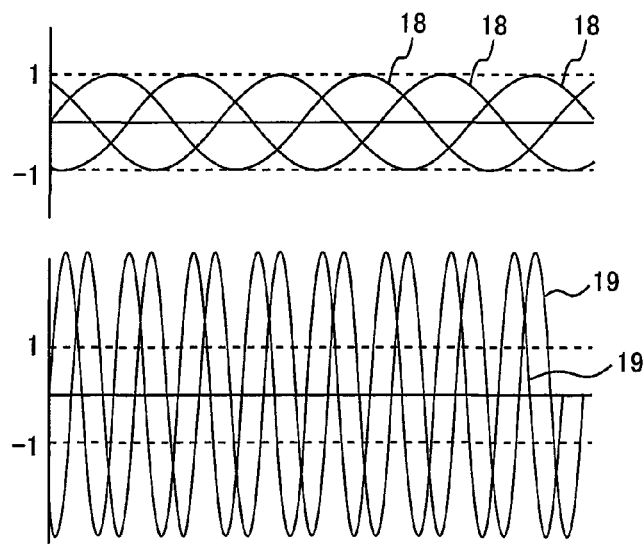
FIG. 3 explains phase currents when an inter-phase short circuit exists in the present invention.

FIG. 3 illustrates a comparison of phase currents between in a normal state and in an inter-phase short circuit state. Motor cables in an inter-phase short circuit state have minimum motor inter-phase inductances. As a result, the short-circuited motor phase currents become excessively greater than the command value as shown in FIG. 3(b), thereby causing an oscillation due to a current feedback control. For example, the amplitude of short-circuited phase current waveforms 19 in an inter-phase short circuit state is more than doubled compared to that of current waveforms 18 in a normal state in FIG. 3(a).

This difference in motor current can be utilized to detect an inter-phase short circuit by picking out data for a predetermined time period from the sampled U, V and W phase current data, respectively.

Figure 2:
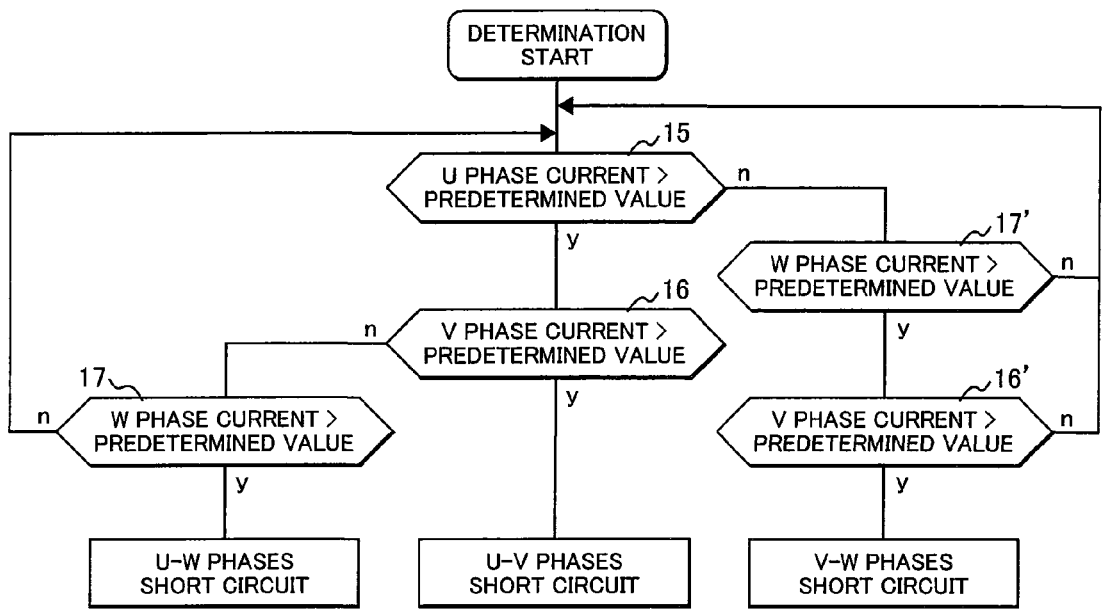
FIG. 2 is a flow chart for detecting an inter-phase short circuit according to an embodiment of the present invention.

FIG. 2 is a flow chart of a method for detecting an inter-phase short circuit according to the present embodiment. An occurrence of an inter-phase short circuit is detected based on data sampled from each current in the U, V and W phases. Here, the data sampled from each phase current are stored in the storage device in the processor. Further, a current reference value used for judging whether or not a short circuit state (abnormal state) occurs is predetermined in advance and stored in the storage device. Thus, the sampled current data can be compared with the current reference value in the processor to detect whether or not a short circuit state occurs.

A diagnosis is started at a state 15 for determining whether or not the U phase current exceeds a predetermined value. When the U phase current is determined to exceed the predetermined value at this state, a state 16 is then entered to evaluate the V phase current.

The state 16 determines whether or not the V phase current exceeds the predetermined value. When the V phase current is determined to exceed the predetermined value at this state, it is determined that a short-circuit state exists between the U phase and V phase.

On the other hand, when the V phase current is determined not to exceed the predetermined value at the state 16, a state 17 is then entered to evaluate the W phase current. When the W phase current is determined to exceed the predetermined value at this state, it is determined that a short-circuit state exists between the U phase and W phase. When the W phase current is determined not to exceed the predetermined value at this state, the diagnosis start state is reentered.

In addition, when the U phase current is determined not to exceed the predetermined value at the state 15, a state 17' is then entered to evaluate the W phase current. When the W phase current is determined not to exceed the predetermined value at this state, the diagnosis start state is reentered. On the other hand, when the W phase current is determined to exceed the predetermined value, a state 16' for evaluating the V phase current is entered.

When the V phase current is determined to exceed the predetermined value at the state 16', it is determined that a short-circuit state exists between the V phase and W phase. On the other hand, when the V phase current is determined not to exceed the predetermined value, the diagnosis start state is reentered.

In order to more reliably detect an abnormal state, the present embodiment more preferably determines that an inter-phase short circuit exists only when a condition that the corresponding two currents exceed the predetermined value continues for a predetermined time period.

When the motor cables are short-circuited, the inductance and resistance of the motor windings viewed from the inverter are negligible. Therefore, the motor currents rapidly increase to a point where they are excessively greater than the command values. In addition, the phase angle of one of short-circuited phases becomes substantially opposite to the other. These relationships can be utilized to detect a short circuit (abnormal) state of motor cables by incorporating the motor current values into the processor by means of the current detector and others, and examine the current amplitudes and phase relationships.

Here, a processor having a sufficiently high computing speed can quickly detect such an abnormal state, thus suppressing equipment damage caused by an excessive current in the inverter and motor as well as generation of an unintended torque.

In the present embodiment, use of an existing motor control processor or the like is more preferable. The use of an existing motor control processor or the like require no special circuit for detecting a cable abnormality, thus offering an excellent cost to performance ratio. However, an abnormality detection processor may be separated from a motor control processor.

As has been described above, the present embodiment provides a method, and AC motor implementing the method, for detecting a short circuit between the phases of the motor cable (U phase and V phase, U phase and W phase, V phase and W phase) by picking out data for a predetermined time period from the sampled U, V and W phase currents, respectively and examining them.

Embodiment 2

Figure 4:
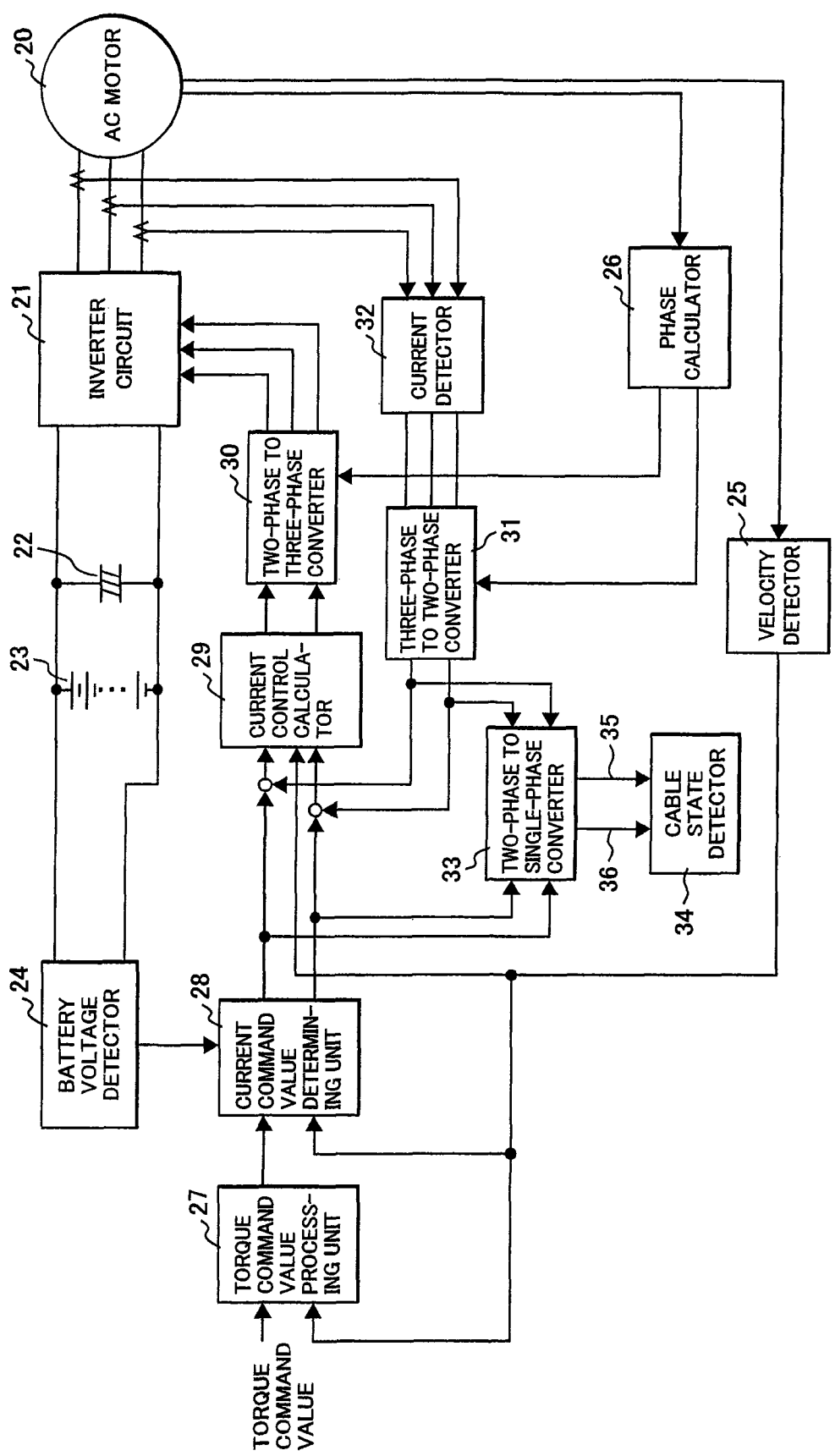
FIG. 4 is a block diagram of an electric vehicle driving system which includes a motor controller for detecting an inter-phase short circuit according to another embodiment of the present invention.

An alternate embodiment for detecting a short circuit between phases will be described with reference to FIGS. 4 and 5. FIG. 4 is a block diagram of an electric vehicle driving system which includes a motor controller of the present embodiment. The same parts of the present embodiment motor controller as in Embodiment 1 will not be repeatedly described here.

In an electric vehicle driving system with a motor controller shown in FIG. 4, the following parts are the same as in the system of FIG. 1: an AC motor 20; an inverter circuit 21; a capacitor 22; a battery 23; a battery detector 24; a velocity detector 25; a phase calculator 26; a torque command value processing unit 27; a current command value determining unit 28; a current control calculator 29; a two-phase to three-phase converter 30; a three-phase to two-phase converter 31; a current detector 32. The system of FIG. 4 differs from that of FIG. 1 in that it includes a two-phase to single-phase converter 33 and a cable state detector 34.

In the system of FIG. 4, three-phase AC currents detected at the current detector 32 are converted to d-axis and q-axis currents by the three-phase to two-phase converter 31. Further, the two-phase to single-phase converter 33 converts the d-axis and q-axis currents to an Iˆrms 35, the effective value of the detected phase currents according to an equation (1).

$$I\hat{r}ms = ((\text{detected } d\text{-axis current})^2 + (\text{detected } q\text{-axis current})^2)^{0.5} \quad (1)$$

Similarly, the two-phase to single-phase converter 33 converts d-axis and q-axis current command values outputted from the current command value determining unit 28 to an I*rms 36, the effective value of the current command values according to an equation (2).

$$I^*rms = ((d\text{-axis current command value})^2 + (q\text{-axis current command value})^2)^{0.5} \quad (2)$$

Here, when phases of the motor cable are short circuited, the inductance between the phases is at its minimum. As a result, the short-circuited motor phase currents become excessively greater than the command values as has been already described. In other words, when the motor currents are represented by the effective value, the detected current effective value Iˆrms 35 exhibits an offset relative to the current command value effective value I*rms 36.

Figure 5:
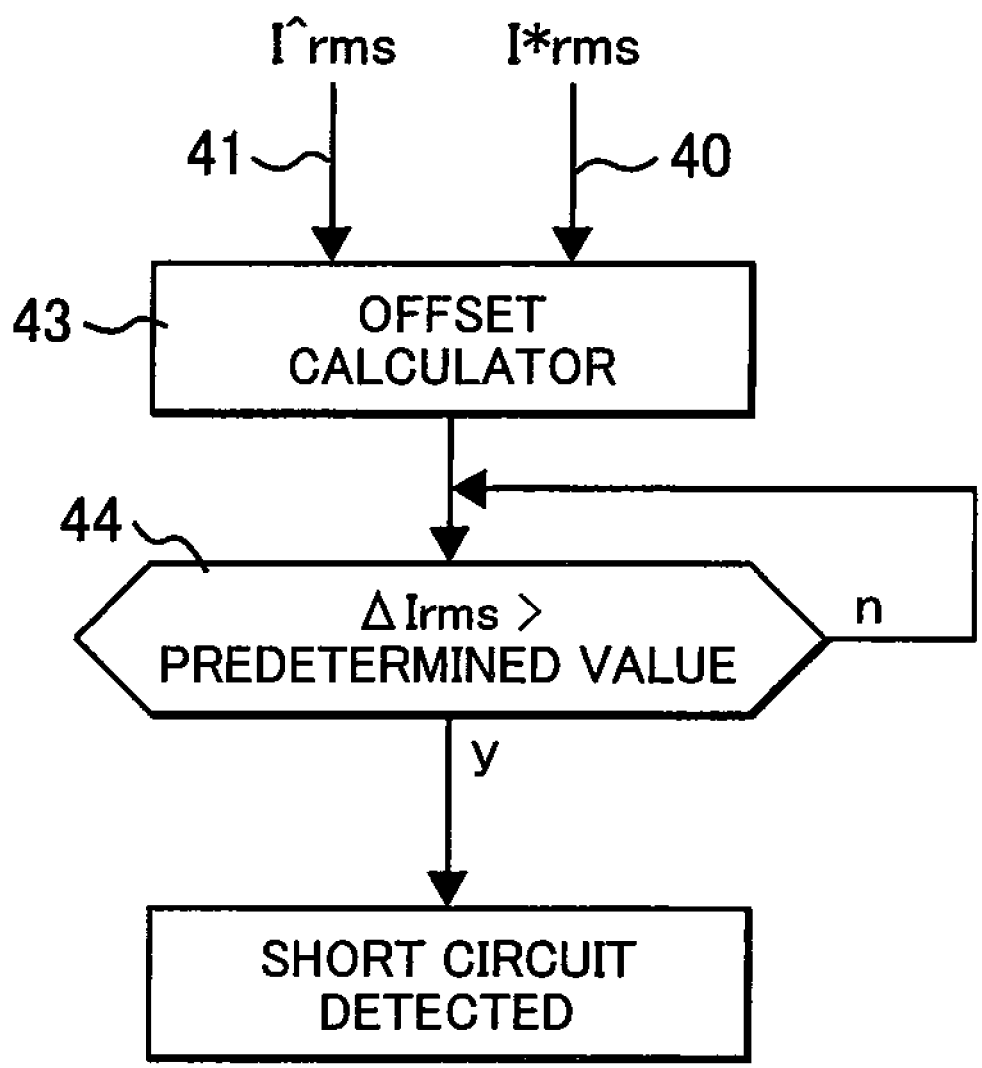
FIG. 5 is a flow chart for detecting an inter-phase short circuit according to another embodiment of the present invention.

FIG. 5 is a flow chart of a method for detecting an inter-phase short circuit according to the present embodiment. As shown in the figure, an offset calculator 43 calculates an offset value ΔIrms from an effective value I*rms 40 of phase current command values and an effective value Iˆrms 41 of detected phase currents. When the offset value ΔIrm 43 exceeds a predetermined value, it is determined that an inter-phase short circuit state exists. In addition, it is more preferable that a filter is applied to the effective value Iˆrms 35 of detected phase currents calculated at the two-phase to single-phase converter 33.

Embodiment 3

Next, an embodiment for detecting an open circuit of cables will be described with reference to FIGS. 1, 6 and 7.

In the electric vehicle driving system with the motor controller shown in FIG. 1, the cable state detector 14 simultaneously samples the AC currents in the U, V and W phases on a regular basis. The sampled values are stored in, for example, the storage device in the processor.

When a phase of the motor cable is open-circuited, the detected current value in the open-circuited phase is theoretically 0 A. So, data for a predetermined time period are picked out from the sampled U, V and W phase currents, respectively.

Figure 6:
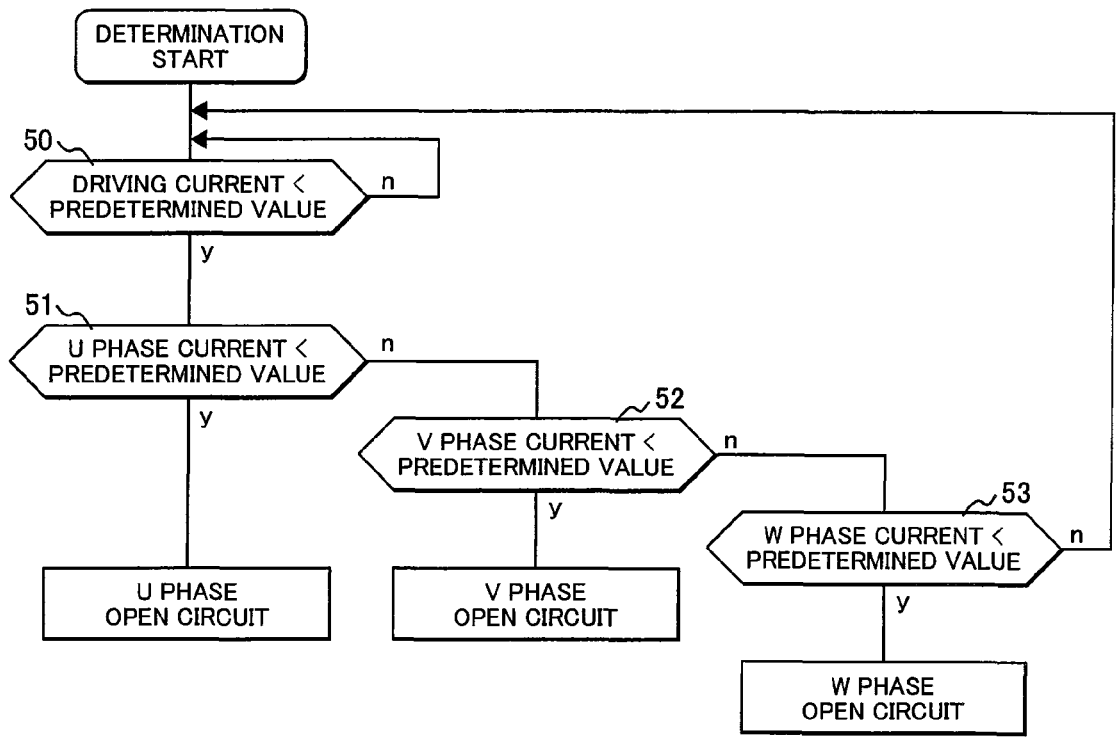
FIG. 6 is a flow chart for detecting an open circuit in phases according to yet another embodiment of the present invention.

FIG. 6 is a flow chart of a method for detecting an open circuit according to the present embodiment. As shown in FIG. 6, at a state 50 for evaluating the driving current value, when the motor driving current value is not less than a predetermined value, the flow remains at the state 50. On the other hand, when the current command value is still not less than the predetermined value and the driving current is determined to be less than the predetermined value, a state 51 is entered to evaluate the U phase current.

At the state 51, when the U phase current is less than the predetermined value, it is determined that the U phase is open-circuited. On the other hand, when the U phase current is not less than the predetermined value, a state 52 is entered to evaluate the V phase current.

At the state 52, when the V phase current is less than the predetermined value, it is determined that the V phase is open-circuited. On the other hand, when the V phase current is not less than the predetermined value, a state 53 is entered to evaluate the W phase current.

At the state 53, when the W phase current is less than the predetermined value, it is determined that the W phase is open-circuited. On the other hand, when the W phase current is not less than the predetermined value, the flow returns to a determination start state.

Figure 7:
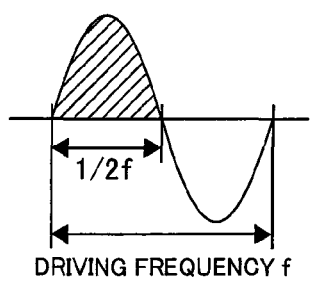
FIG. 7 explains an optimum determination time for detecting an open circuit in phases according to yet another embodiment of the present invention.

FIG. 7 explains an optimum determination time for detecting an open circuit. As can be seen from the figure, the sampling time of the current data is preferably at least a half of the motor driving frequency.

In this manner, the present embodiment realizes a method, and AC motor controller implementing the method, for detecting an open circuit of motor cables by sampling current data in the U, V and W phases during a predetermined time period and evaluating them.

Although embodiments of the present invention have been described in detail, the present invention is not limited to those disclosed embodiments but various modifications can be made without departing from the technical ideas thereof. For example, in the method for detecting an inter-phase short circuit or an open circuit, it is naturally also within the scope of the present invention to alter the order of evaluation of the U, V and W phase current values or to use the current phase instead of the current amplitude to detect an abnormality.

The invention claimed is:

1. An AC motor controller, comprising:

an AC motor;

an inverter for driving the AC motor with three phase motor currents each through a motor cable;

a motor current detector for detecting the three phase motor currents each flowing in the motor cable connected to the AC motor; and a processor operatively associated with the motor current detector and configured to detect while the motor is still running the occurrence of an abnormal state of the motor cable, which abnormal state is a disconnected or unconnected state, based on the three phase motor currents detected by the motor current detector and identify the phase of the motor cable in which the abnormal state occurs, wherein said processor detects the abnormal state of the motor cable when a motor current command value computed based on a torque instruction value of said AC motor is still not less than a predetermined value, and a driving current of said motor computed based on the three phase motor currents is smaller than the predetermined value, and a sampling time in said processor of the motor current data is at least a half cycle of the motor driving frequency.

* * * * *